United States Patent [19]

Kitahara et al.

[11] Patent Number: 5,029,043
[45] Date of Patent: Jul. 2, 1991

[54] LC CIRCUIT INCORPORATED CERAMIC SUBSTRATE

[75] Inventors: Naoto Kitahara, Tokyo; Masami Koshimura, Chichibu; Mikiya Ono, Tokorozawa, all of Japan

[73] Assignee: Mitsubishi Mining and Cement Co., Ltd., Tokyo, Japan

[21] Appl. No.: 497,606

[22] Filed: Mar. 22, 1990

[30] Foreign Application Priority Data

Mar. 23, 1989 [JP] Japan .................................. 1-69304

[51] Int. Cl.[5] .......................... H01G 4/10; H01F 5/00

[52] U.S. Cl. .................................... 361/321; 336/200

[58] Field of Search ......................... 361/321; 336/200

[56] References Cited

U.S. PATENT DOCUMENTS

| | | | |
|---|---|---|---|
| 2,648,804 | 8/1953 | Steigerwalt et al. | 336/200 X |
| 3,900,773 | 8/1975 | Bowkley et al. | 361/321 X |
| 4,322,698 | 3/1982 | Takahashi et al. | 336/200 X |
| 4,573,101 | 2/1986 | Takeno | 361/321 |
| 4,689,594 | 8/1987 | Kawabata et al. | 336/200 |
| 4,758,922 | 7/1988 | Ishigaki et al. | 361/321 X |

*Primary Examiner*—Donald A. Griffin
*Attorney, Agent, or Firm*—Hoffman, Wasson & Gitler

[57] ABSTRACT

There is provided a monolithic structure of an LC circuit incorporated component comprising at least one capacitor formed from internal electrodes in layered form in a ceramic monolithic structure, at least one inductor formed from internal conductive structure in coil form in said monolithic structure, internal connecting leads for connecting said capacitor(s) and inductor(s) to form said circuit, formed in said structure, and terminals for the circuit, formed at the surface(s) of the component.

4 Claims, 5 Drawing Sheets

BaTiO$_3$-Ni·Zn FERRITE
(NiO:ZnO:Fe$_2$O$_3$=
0.15:0.35:0.50)

BaTiO$_3$-Mn·Zn FERRITE
(MnO:ZnO:Fe$_2$O$_3$=
0.225:0.22:0.525)

PbTiO3-Ni·Zn FERRITE
(NiO:ZnO:Fe2O3
= 0.15:0.35:0.50)

PbTiO3-Mn·Zn FERRITE
(MnO:ZnO:Fe2O3
= 0.225:0.22:0.525)

SrTiO4-NiZn FERRITE
(NiO:ZnO:Fe2O3 = 0.15:0.35:0.50)

SrTiO3-Mn·Zn FERRITE
(MnO:ZnO:Fe2O3 = 0.225:0.22:0.525)

LC CIRCUIT INCORPORATED CERAMIC SUBSTRATE

FIELD OF THE INVENTION

The present invention relates to structure of multilayered LC circuit-incorporated ceramic component. Particularly, it relates to the specific structure of multilayered ceramic substrate including both capacitance and inductance curcuits.

DESCRIPTION OF THE PRIOR ART

Many attempts have been made to provide miniaturization of integrated circuits in the same ceramic material incorporating both capacitance function and inductance function. However, there have not been found ceramic material having both features of dielectricity to provide capacitance function and of magneticity to provide inductance function.

There have been many attempts of miniaturization of an integrated circuit substrate incorporating both of capacitance function and inductance function. However, there have been provided no materials having dielectricity enough to provide capacitance and magnesity enough to provide inductance, and then, the conventional LC incorporated ceramic component has been produced by firing separately a multilayered capacitance element and a multilayered ceramic inductance element, and then combining or adhering the two fired elements. The alternative method of production of such conventional LC incorporated component comprises forming separately a ceramic green shaped body having capacitance electrodes and a ceramic green body having inductance feature.

Because such method uses at least two different species of materials, the production process is complicated and further, the levels of the top surface of the dielectric layered body and the magnetic layered body should be at the same level.

There are known ceramic multilayered structures incorporating capacitors, as disclosed in U.S. Pat. No. 4,082,906, in which monolithic capacitors are fired with incorporating internal electrodes in a dielectric ceramic body, and further outer electrodes therefor.

SUMMARY OF THE INVENTION

With the foregoing considerations in mind, the present invention contemplates the provision of the ceramic multilayered discrete component incorporating capacitance and inductance circuits.

It is an object of the present invention to provide a new structure of an LC circuit incorporated discrete component in the form of a monolithic multilayered ceramics structure.

It is another object of the present invention to provide a discrete LC incorporated component which can be economically fabricated and and has significantly improved electric properties.

As described in the foregoings, the inventive discrete component incorporating capacitance and inductance circuit will enable economical process for manufacturing a monolithic circuit component having LC circuit.

DETAILED DESCRIPTION OF PREFERRED EMBODIMENTS

Figure 1:
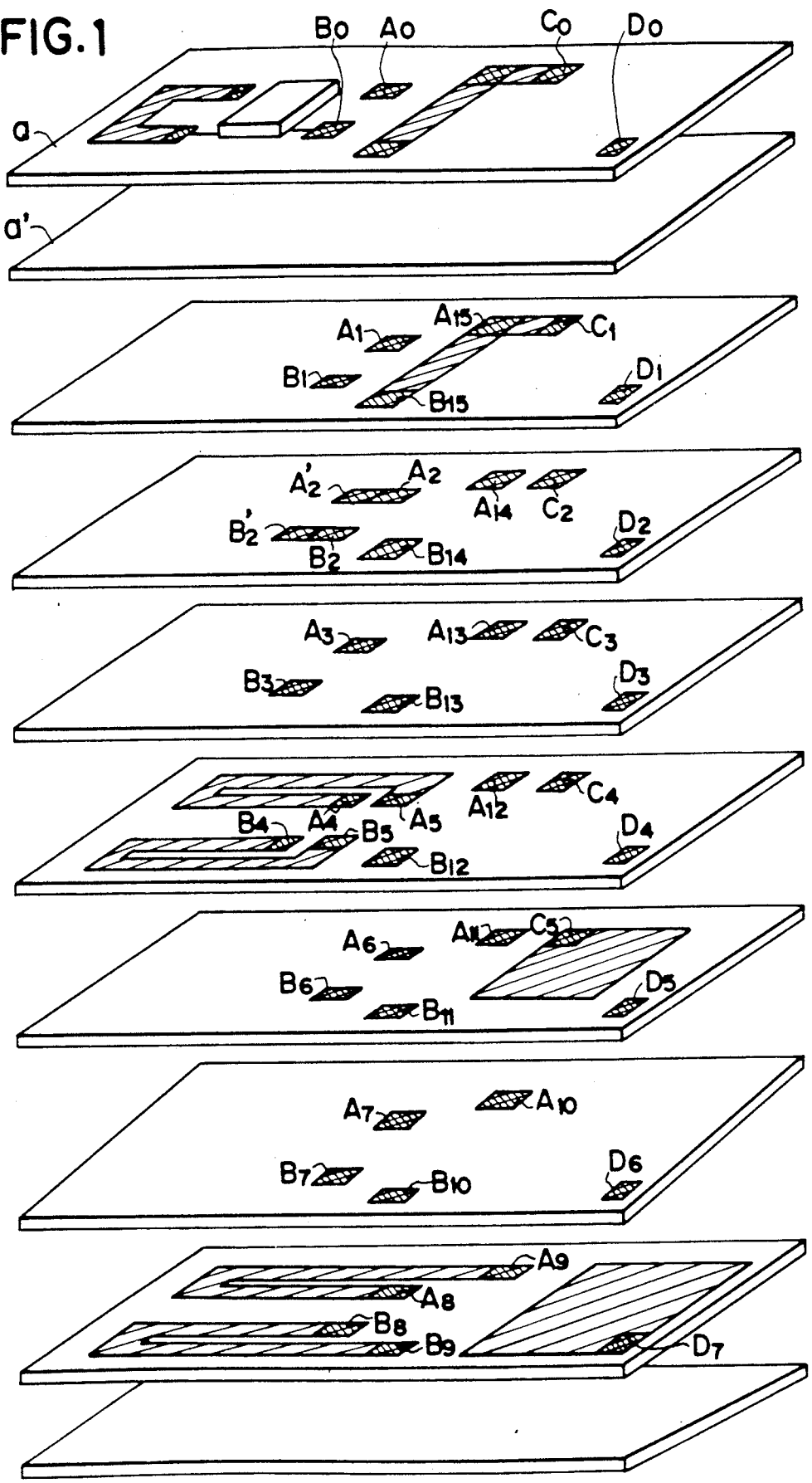
FIG. 1 shows an exploded view of the inventive structure of a ceramic substrate incorporating LC circuit, wherein each conductive pattern incorporating layer to be stacked into the inventive structure is shown respectively and separately, and a top insulating layer and glass layer to be stacked on the top of the structure are shown as a and a'.

In accordance with the present invention, the structure of the the ceramic composition having the dielectric constant of more than 20, and permeability of more than 1 is used to compose the substrate of the present invention.

The composite material for the substrate can be a sintered body of the combination of ferrite of the formula: $MFe_2O_4$ wherein M is one or more in combination, selected from the group consisting of manganese, nickel, magnesium, cobalt, copper, zinc and iron, and one or more in combination selected from the group consisting of barium titanate $BaTiO_3$, lead titanate $PbTiO_3$ and strontium titanate $SrTiO_3$.

This sintered body can be used to compose the substrate or the material for multilayered circuit having the inventive structure.

This composite sintered body can have both of magnetic feature and dielectric feature, and then, both of the magnetic permeability and dielectric constant can be appropriately selected or chosen. The fired ceramic material for use in such sintered body has preferably dielectric constant of higher than 20, and permeability of more than one. When the dielectric constant is less than 20, the capacity formed in the layered component will be not enough. On the other hand, when the permeability is less than one, the magnecity is not enough to form inductance in the layered body.

In accordance with the inventive structure of the LC-incorporated ceramic multilayered component, internal electrodes for capacitance and internal conductive structure in coil form for inductance circuit are formed in a ceramic composite multilayered structure having both of high dielectricity and magneticity and integrated therein.

The ceramic composite structure can be produced by mixing powder of titanate dielectric material having size of 30 to 120 microns and powder of ferrite magnetic material having the similar size, and forming a slurry from the mixture, and forming thin ceramic films from the slurry, and firing the films, and stacking the fired films with internal conductive coil structure(s) and internal electrodes therein in a predetermined geometry and configuration, so as to form a stacked body of the ceramic structure containing these internal conductive coil structure and internal electrodes, and further firing the resulting stacked body to produce the LC incorporated monolithic component.

The starting material powders should have grain size of 30 to 120 microns. When the size is less than 30 microns, the materials of ferrite and dielectric composition would be reacted together in firing process, to produce the other undesired compounds having not-enough dielectricity and magneticity. Further, when the size of the starting materials is higher than 120 microns, a locally distributed, or localization of dielectricity and permeability is generated within the structure of the component, so as to provide instability in capacitance and inductance formed in the structure.

The new composite structure of the present invention uses at least one dielectric compound selected from barium titanate $BaTiO_3$, lead titanate $PbTiO_3$ and strontium titanate $SrTiO_3$, and the combination thereof, and Ni-Zn ferrite compound composition. Against the composite multilayered structure, internal conductive layers or structure in a predetermined geometry and configuration in the ceramic component are formed using a conductive paste of metal(s) selected from gold Au, silver Ag, copper Cu and palladium Pd.

The green films formed from the new composition having desired dielectric constant and permeability are stacked with forming predetermined patterns on and in the green films being stacked, and then the stacked body with the internal conductive structure and internal electrodes is fired to produce the monolithic component incorporating LC-circuits.

The material for the internal electrodes to make a capacitor in the new structure or new geometry in a monolithic component is preferably highly conductive, heat-resistant, weather-resistant (durable) composition usable to form a thin film, which is preferably consisting essentially of Ag. but is not limited. The internal electrodes can be formed by using a conventional printing lithography.

Further, the internal conductive structure to make an inductance circuit in the new structure in a monolithic component is preferably highly conductive, and can be the same material for the above-mentioned internal electrodes.

The terminals for such capacitor(s) and inductor(s) circuit can be formed at the outer surface(s) of the ceramic structure by forming conductive paste patterns connecting the capacitor or inductor on the surface or edge of the ceramic structure, and firing the paste patterns together the stacked ceramic structure. Alternatively, the terminals can be on or in the edge(s) of the structure in various forms to form conductive thin film(s) used as an electrode.

The new structure having both of capacitor(s) and inductor(s) circuit(s) can be fabricated by any of multilayering techniques. For example, ceramic sheets of the above-mentioned composition are formed, and then, conductive paste is applied on the surfaces of the formed sheets to form pattern for internal electrodes and internal conductive coil structure, and the sheets with such patterns are stacked to stacked ceramic body, which body is fired. Alternatively, a multilayered structure with internal electrodes and internal conductive coil configuration is formed by using paste of the above-mentioned dielectric and magnetic composition, and a conductive paste and a printing technique to form multilayered patterns as predetermined, and the multilayered structure is fired to form a ceramic fired body with internal electrodes to form capacitor(s) and internal conductive coil structure to form inductor(s) therein.

FIG. 1 illustrates schematically the inventive monolithic structure of the LC circuit incorporated component, wherein ceramic insulating film (a) covers a composite ceramic structure having a composite ceramic composition formed from ferrite material and dielectric material powders, with conjunction layer (a') of glass. Outer terminals such as $A_0$, $B_0$, $C_0$ and $D_0$ are formed at the surface of the cover film a, and leads formed in a throughhole in the films (a) and and in a conjunction layer (glass layer) (a') connect the inner terminals $A_1$, $B_1$, $C_1$ and $D_1$ of a capacitor formed in the ceramic structure to the terminals such as $A_0$.

Internal electrodes $C_5$ and $D_7$ formed in the ceramic structure will construct a capacitor, and on the other hand the internal conductive structure $A_1$ to $A_{15}$ and $B_1$ to $B_{15}$ formed in coil form in the ceramic structure will construct an inductor. Then, each of the internal electrodes and the internal conductive structure has inner terminals such as $A_0$, $B_0$, $C_0$ and $D_0$.

Further, leads or connecting patterns can be formed in a conjunction layer (a) and/or on the surface of the structure, in a predetermined circuit pattern, or a predetermined geometry.

Preferably, the firing temperature should be enough high to result in sintering in the body, but not so high to occur chemical reaction between the dielectric compound(s) and magnetic compound(s).

The present invention is further illustrated by the following example to show manufacture of the inventive ceramic structure incorporating LC circuit, using Ni-Zn ferrite $(Ni_{0.3}Zn_{0.7})Fe_2O_4$ and barium titanate $BaTiO_3$, but should not be interpreted for the limitation of the invention.

EXAMPLE

[Preparation of Starting Particulate Materials]

Powders of $NiCO_3$, $ZnO$ and $Fe_2O_3$ were used as starting materials, in a molar ratio of $NiO:ZnO:Fe_2O_3 = 3:7:10$, and ground together, and were calcined at 1,000° C., and milled to provide powder of $(Ni_{0.3}Zb_{0.7})Fe_2O_4$. On the other hand, $BaCO_3$ and $TiO_2$ powder were used as starting materials in a molar ratio of $BaCO_3:TiO_2 = 1:1$, and ground and fired at about 1,150° C., and then milled to provide powder of $BaTiO_3$.

Next, the powders of $(Ni_{0.3}Zb_{0.7})Fe_2O_4$ and $BaTiO_3$ were mixed in a predetermined ratio, and organic binder was added to the mixture to produce a powder paste of dielectric material and magnetic material.

A conductive paste of Pd (or Ag/Pd) was used to form conductive patterns for the inventive structure. The conductive patterns can be formed in the structure in form of layers for the formation of capacitance and inductance.

The resulting green body of the structure was fired at the temperature of about 1250° C. for four to ten hours resulting in the multilayered LC-incorporated component.

[Structure of Green Stacked Body for the LC-circuit Incorporated Component]

The fired films as shown in FIG. 1 were stacked with insertion of conductive layers of the predetermined patterns to form patterns for coil-shaped conductive structure and multilayered capacitors in the ceramic layered structure as shown in FIG. 1, together with the terminals such as $A_0$, $B_0$, $C_0$ and $D_0$ at the surface of the component. Further, throughholes were formed in the layered composite to produce the terminals for capacitors and inductance elements, at the surface of the ceramic layered structure.

Next, finally glass paste was applied on the surfaces of such structure, excepting on the surfaces of the terminals for the capacitor(s) and the inductance element(s) by using a printing technique. Further, alumina film having 100 microns with glass coating as to face to the glass paste coating was applied to the surface of the structure, and the pressure was applied on the composite structure, and then, the composite structure was heated with pressure at the temperature of 500° C. to 800° C. so as to form adhesion of the alumina film to the surface of the ceramic structure.

The resulting composite structure has LC circuit therein.

Figure 3:
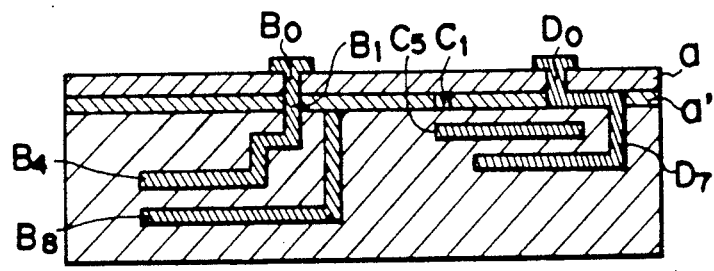
FIG. 3 shows a sectional view of the structure shown in FIG. 1.
Figure 4A:
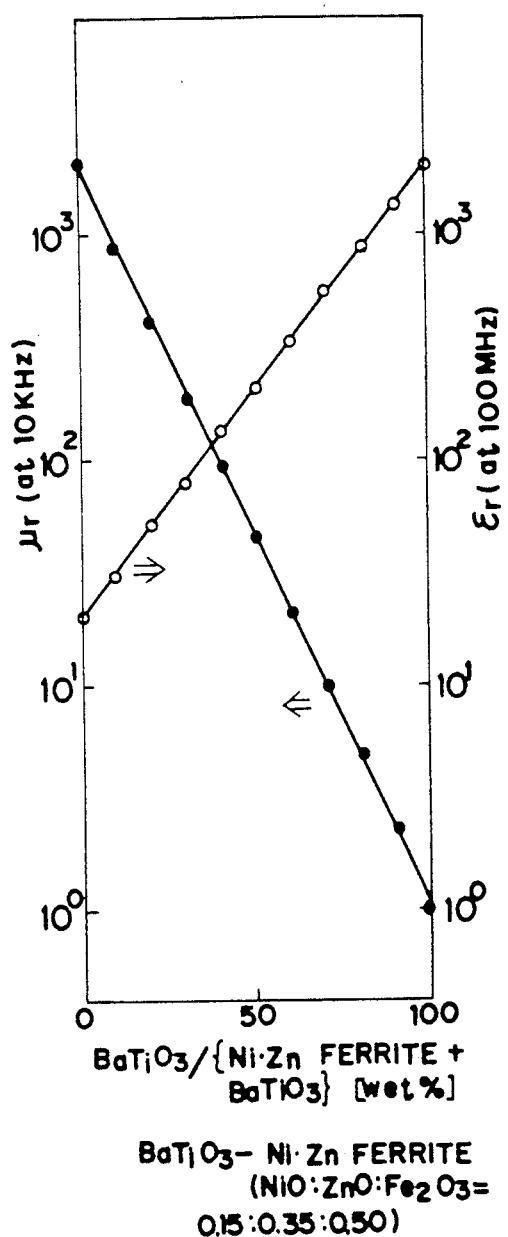
FIGS. 4 A, B, C, D, E and F are graphs showing the dependence of the dielectric constants and magnetic permeability of the composition, on the ceramic component ratio of barium titanate and ferrite used in the inventive ceramic structures which can incorporate LC circuits.
Figure 4B:
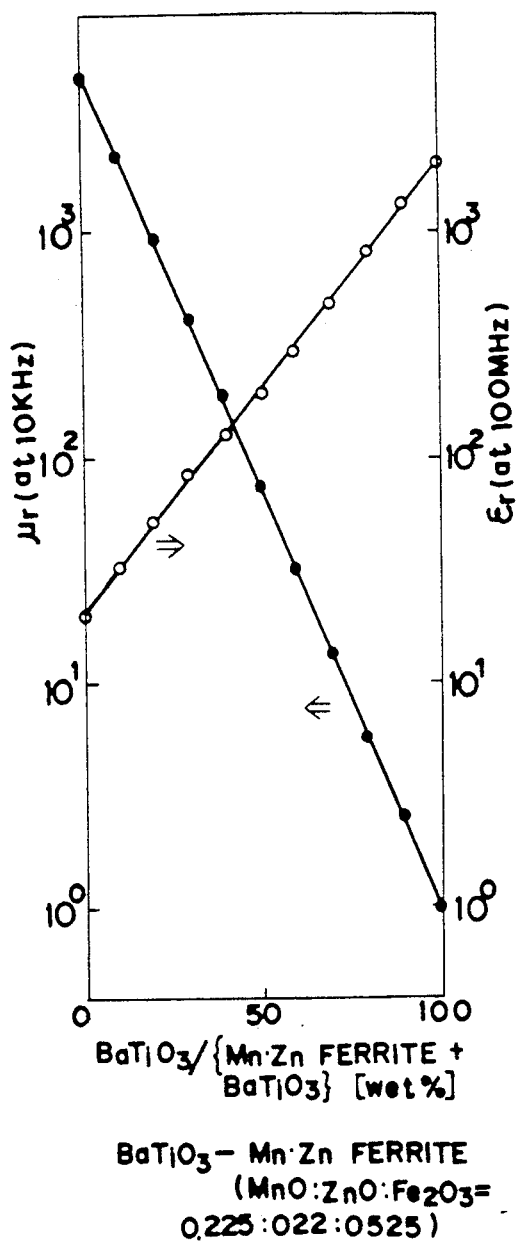
Figure 4C:
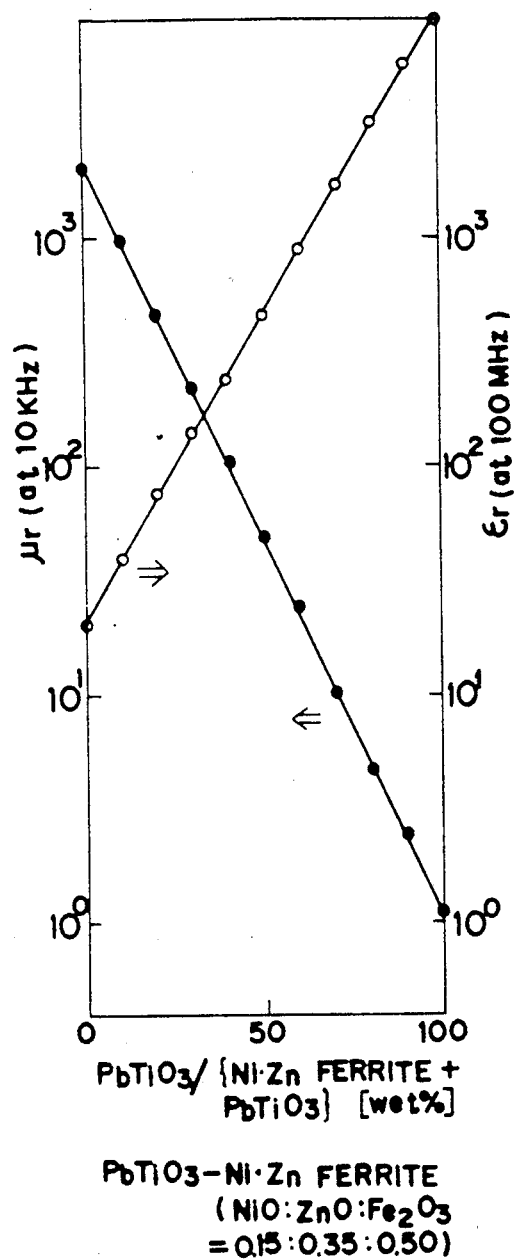
Figure 4D:
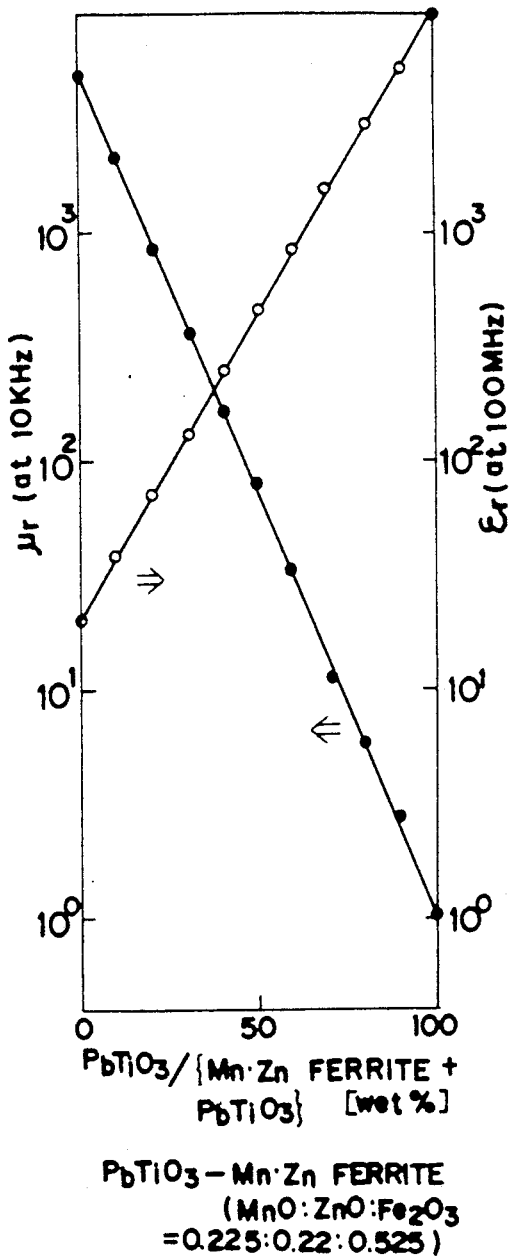
Figure 4E:
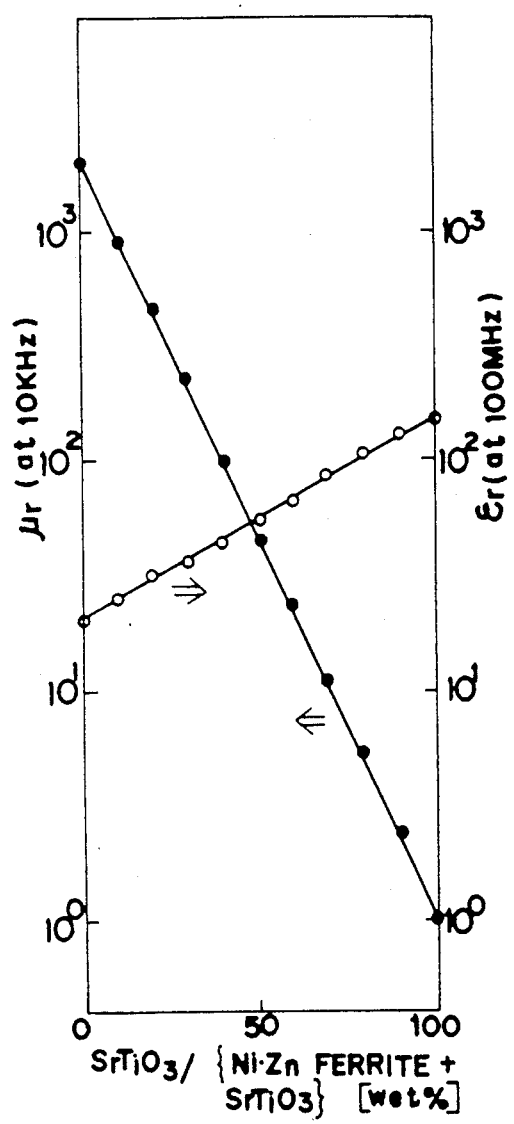
Figure 4F:
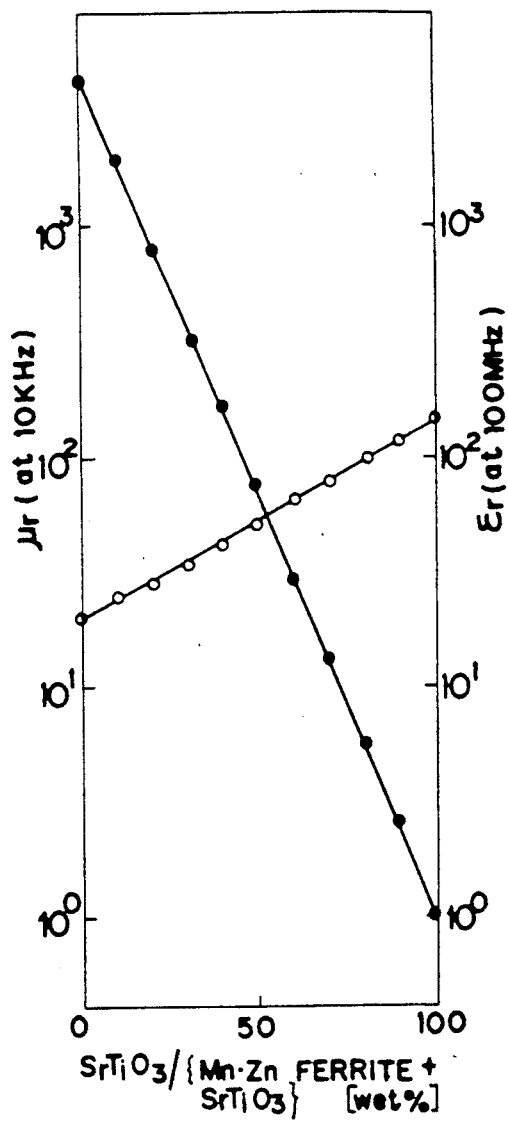

FIG. 1 shows an exploded view of the whole component incorporating LC circuit, wherein FIG. 3 shows a sectional view of the inventive structure of FIG. 1.

Figure 2:
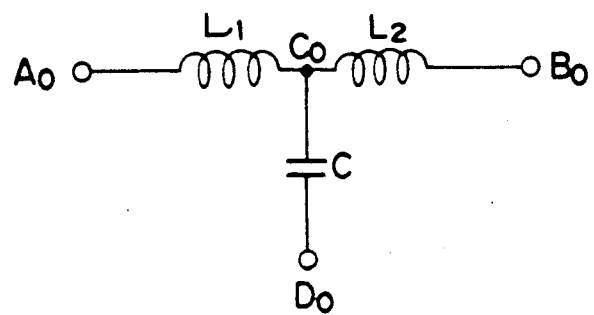
FIG. 2 illustrates an equivalent circuit diagram formed in the structure shown in FIG. 1.

FIG. 2 shows an equivalent circuit formed in the structure shown in FIG. 1.

The LC-incorporated discrete component of FIG. 1 has a ceramic multilayered structure of dielectric and magnetic composite material, internal facing electrodes $C_5$ and $D_7$ formed of Ag/Pd conductive paste to form the capacitor, and internal electrode as $A_1$ to $A_{15}$ and $B_1$ to $B_{15}$ in FIG. 1, formed of the same paste to form the inductor, as shown in FIGS. 1 and 3.

The internal structure within the ceramic composite multilayered body is in section, as shown in FIG. 3. The left portion of the ceramic structure of FIG. 1 contains internal electrodes $C_5$ and $D_7$ facing together to form a capacitor. Then, each of outer terminals $C_1$ and $D_1$ formed on the surface of the body is connecting respectively to the outer terminals $C_0$ and $D_0$. The right portion of the ceramic structure of FIG. 1 contains an inductor structure $A_1$ to $A_{15}$ and $B_1$ to $B_{15}$, that is, an internal conductive structure in coil form so as to form an inductor. Therefore, the inventive discrete component has both of capacitors and inductor in the ceramic composite body.

In accordance with the present invention, the composite materials to form the ceramic structure can be formed from the combination of various ferrite material and dielectric material. Then, FIGS. 4 A, B, C, D, E and F show the relation of the composition to the dielectric constant and permeability of the resulting composite materials.

The graphs of FIGS. 4 A to F show the result of the measurement of dielectric constant and permeability in regard to the composite ceramic materials prepared from the predetermined combination of $BaTiO_3$ powder having grain size of 50 to 100 microns, and ferrite material having grain size of less than 10 microns. $BaTiO_3$ powder having grain size of 50 to 100 microns, and ferrite material having grain size of less than 10 microns were mixed in a predetermined ratio, and molded into a disc shape. The disc was heated to the temperature of 1,250° C. at a raising rate of 400° C./hour and maintained at the temperature of 1,250° C. for four hours and naturally cooled. The fired sample disc was measured on dielectric constant and permeability in accordance with a standard method by using LCR meter (YHP 4278A) available from Yokokawa Hewlett Packard.

Within the ceramic body of the above-mentioned composite material, the internal electrodes, i.e. internal conductive patterns $C_1$ to $C_5$ and $D_1$ to $D_7$ to form a capacitor, and connecting to the outer electrodes(terminals) $C_0$ and $D_0$ are formed to the capacitor C of FIG. 2, and further, the internal conductive structures, i.e. conductive patterns $A_1$ to $A_{15}$ and $B_1$ to $B_{15}$, in coil form are formed within the ceramic body, so as to form inductors $L_1$ and $L_2$ of FIG. 2.

Further, the outer terminals $A_0$, $B_0$, and $C_0$ are on the surface of the outer insulating sheet adhered on the LC-incorporated discrete component (a) by a printing technique so as to form the desired circuit or patterns.

Further, on the outer surface(s) of the inventive LC-incorporated discrete component, the outer electrodes $A_0$, $B_0$, and $D_0$ are formed by a printing lithography to produce the desired circuit(s), and further, a tip element such as a transistor can be provided on the surface, so as to produce complex circuits, or hybrid circuit.

As described in the foregoings, the inventive ceramic structure incorporating LC circuit will enable to miniature the integrated circuit including capacitance and inductance circuit(s). Further, the inventive structure can enable to facilitate the LC-incorporated discrete component.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalence of the claims are therefore intended to be embraced therein.

We claim:

1. A monolithic structure of an LC-circuit incorporated component comprising:
    (a) at least one capacitor formed from internal electrodes in layered form in a ceramic monolithic structure;
    (b) at least one coil inductor formed from an internal conductive structure in said monolithic structure;
    (c) internal connecting leads for connecting the capacitor and the inductor to form a circuit in said monolithic structure; and
    (d) terminals for the circuit, formed at the surface of the component,
    wherein the ceramic structure is comprised of a dielectric and a magnetic material having a grain size of from 30 to 120 microns, and wherein at least one of the leads is formed through a throughhole formed in the structure; and
    wherein the dielectric material is selected from the group consisting of barium titanate, lead litinate, strontium titanate and combinations thereof; and
    wherein the magnetic material is a ferrite material of the general formula $MFe_2O_4$, wherein M is selected from the group consisting of manganese, nickel, magnesium, cobalt, copper, zinc, iron, and combinations thereof.

2. A structure in accordance with claim 1, wherein said structure further comprises at least one surface ceramic film which has been prefired and adhered onto the top surface of the structure.

3. A structure in accordance with claim 2, wherein said film is adhered to said top surface of said structure by using a solder, glass or conductive paste, each of which is located at predetermined positions on said surface of said structure and film.

4. A structure in accordance with claim 1, wherein said dielectric material has a dielectricity greater that 20 and wherein said magnetic material has a permeability greater than 1.

* * * * *